United States Patent [19]
Lin et al.

[11] Patent Number: 5,543,620
[45] Date of Patent: Aug. 6, 1996

[54] WIDE-VIEW-ANGLE AND PLANARIZED-PACKING STRUCTURE FOR IR HEAT SENSING ELEMENTS

[75] Inventors: San-Bao Lin, Chungli; Gwo-Dawn Chang, Taipei Hsien; Jin-Shown Shie; Chein-Hsun Wang, both of Hsinchu; Ping-Kuo Weng, Taoyuan Hsien; Ming-Der Lin, Hsinchu, all of Taiwan

[73] Assignee: Opto Tech Corporation, Hsinchu, Taiwan

[21] Appl. No.: 352,067

[22] Filed: Nov. 30, 1994

[51] Int. Cl.⁶ .................................. G01J 5/02; G01J 5/00
[52] U.S. Cl. .................................. 250/338.3; 250/338.1; 250/342; 250/353
[58] Field of Search .............................. 250/338.3, 342, 250/353, 338.1, DIG. 1

[56] References Cited

U.S. PATENT DOCUMENTS 4,755,674  7/1988  Schaaf ................... 250/338.1
5,344,518  9/1994  Ito et al. ................ 250/338.1

FOREIGN PATENT DOCUMENTS 59-183341  10/1984  Japan ................... 250/338.3
62827150   5/1988   Japan ................... 250/338.3
2240528    9/1990   Japan ................... 250/338.1

Primary Examiner—Constantine Hannaher
Assistant Examiner—Virgil O. Tyler
Attorney, Agent, or Firm—Cushman Darby & Cushman, L.L.P.

[57] ABSTRACT

A structure for pyroelectric IR heat-sensing elements having a wide angle field of view is made by forming the essential heat-sensing elements and the related electronic elements into a planarized-packing configuration suitable for surface bonding. The heat-sensing elements are caused to be inclined and facing each other in a suspended structure so as to increase the sensing viewing angle.

7 Claims, 12 Drawing Sheets

WIDE-VIEW-ANGLE AND PLANARIZED-PACKING STRUCTURE FOR IR HEAT SENSING ELEMENTS

BACKGROUND OF THE INVENTION

The present invention relates to a planarized-packing device and structure for pyroelectric IR sensing elements and, in particular, to such a device and structure having a greater viewing angle for sensing.

Recently, heat-sensing security monitoring systems have become increasingly popular. The popularity of such systems is substantially the result of the development of pyroelectric IR heat-sensing elements. Pyroelectric IR heat-sensing elements generate a corresponding electrical signal in response to the IR heat wave radiated from an approaching person or heat source. The electrical signal is then amplified for use by the preventive alarm or triggering circuit of a security system. Pyroelectric IR heat-sensing elements have the following advantages:

1. The pyroelectric effect is a differential function of time so that it provides automatic background (static background heat source) suppression, thus effecting dynamic sensing and simplifying signal processing;

2. Pyroelectricity is generated spontaneously without the application of bias voltage, thus avoiding noise caused by bias voltage; and 3. The elements are made using the same simple techniques as those used for making typical ceramic capacitors. They can be made by such reduced-cost techniques as coating with electrodes and vapor depositing with black body film.

The above advantages make it feasible to provide inexpensive non-contact radiation heat-sensing elements capable of operating at room temperatures. In recent years, such heat-sensing elements have been widely used in burglar and fire prevention systems and in sensors for power-saving light controllers. As a result, more and more studies in pyroelectric IR heat-sensing elements are presently being undertaken.

In general, heat sensing elements must be made as thin as possible so as to reduce heat capacity. At the same time, they have to be made in a suspended structure so as to reduce heat loss, i.e., increase thermal impedance. If made this way, when the elements absorb heat energy, they can produce a higher temperature rise, i.e., have a higher thermal response, and thereby provide a greater pyroelectric response. Unfortunately, requiring the elements to have a thin and suspended structure causes the adhering technique needed for their assembly to become complicated. In short, much improvement is needed in making the radiation heat-sensing elements having these complicated structure and device requirements.

In FIG. 1, there is shown the equivalent circuit of a conventional two-piece pyroelectric sensing element (in phantom lined box) wherein pyroelectric sensing elements A1 and A2 may be made of thin sheets of a pyroelectric material such as $LiTaO^3$, PZT, PVF2 or TGS. The pyroelectric sensing elements A1 and A2 each are plated with electrodes on both sides thereof and each have their upper surface coated with a black body film for increasing the heat absorbing effect. The two sheet sensing elements are opposite in direction of polarity as shown by the arrows, with one facing up and the other facing down. The static charge or voltage resulting from heat induction in elements A1 and A2 is transferred to a field effect transistor (JFET) Q of high input impedance which serves as an impedance buffer for an external circuit. The field effect transistor Q outputs a signal from a terminal L2. A load resistor RL of high resistivity is provided in parallel between the output ends of the sheet sensing elements A1 and A2 to balance the leakage of the pyroelectric induced charge and the transmission of low frequency noises, and to select the bandwidth for the circuit. Two heat sensing pieces are provided in order to eliminate the microphonic noise caused by vibration and to reject the common mode signal resulting from changes in background heat radiation. The assembly of the above elements must be placed in a sealed metal container to prevent reduction of signal-to-noise ratio due to interference from electromagnetic noises.

FIG. 5 shows two-piece heat sensing element 'S' used in a heat inducing system having a multiple IR focusing leans array L. The lens array L in front of the element S divides the field of view of the system into a plurality of small fields of view (shown in slanted lines) such that any heat wave generated by a moving heat-emitted body, e.g., the heat wave from a person, may be imaged alternatively on and absorbed by the two pyroelectric sensing elements. This causes alternative temperature rise and fall in the two elements, thus generating a differential output signal in the frequency of about 1 to 10 Hz.

FIGS. 2 and 3 show, respectively, the structures of two types of presently commercially available pyroelectric sensing elements. In the conventional structure shown in FIG. 2, a pair of strip-like insulating pads 102, 103 are adhered to a metal base 101, and then a pair of pyroelectric sheet elements A1 and A2 (as shown in FIG. 1) are bridged thereon at a position where the optical system is focused. In addition, other elements such as the field effect transistor JFET and the load resistor RL as shown in FIG. 1 have to be provided on an insulating pad 104 affixed to the base so as to prevent short-circuit to the metal base 101. After this complicated structure is formed, ultrasonic wire welding such as that practiced in conventional semiconductor device packaging techniques is carried out to make the necessary circuit connections. Then, the structure is sealed by having a cover 106 welded thereto. A multi-layer silicon long wavelength infrared (LWIR) filter 105 is adhered to the cover for transmitting heat waves having 6–14 micron wavelengths while suppressing background light rays of other wavelengths.

In the structure of another conventional pyroelectric sensing element as shown in FIG. 3, a plurality of arcuated welding wire rings 108 are further provided on a ceramic insulating pad 107, and then pyroelectric sheet elements (diagrammatically shown by reference number A) are adhered to the upper ends of respective welding wire rings 108 to obtain a suspended heat isolation structure.

In both of the conventional pyroelectric element structures shown above, a stacking approach is utilized for suspension and heat insulation purposes. This approach causes the packaging of the elements and the structure of the products to become relatively complicated and unsuitable for automated assembling operation, thus resulting in high labor cost. Moreover, the metal base is rather expensive, accounting for a relatively high percentage (about 25%) of the cost of the materials, and insulating pads must be provided to prevent conduction to the base, both substantially increasing the manufacturing and processing costs.

To cope with such adverse factors, a special planarized-packing structure as shown in FIG. 4A is proposed (see ROC Utility Model Patent No. 67164) in which a double-sided circuit board 201 is formed with a conductive copper foil 204 having a special circuit layout and connection such that the elements as shown in FIG. 1 can be disposed by using the surface mounting technique (SMT). A plurality of through holes 202 are set in the circuit board 201 for pins 203 to pass through. An automatic riveting technique is used such that the pyroelectric elements are placed accurately at desired positions during an assembling operation. The structure of said ROC Utility Model No. 67164 is characterized by an undercut well 205 which is set on the region of the circuit board where the sheets of pyroelectric material A1 and A2 are provided so that the sheets of pyroelectric material A1 and A2 bridge over it. The undercut well 205 is also spread with the copper foils 204. A side cross section view of the structure is shown in FIG. 4B. With the pyroelectric elements A1 and A2 bridged over the region of the well 205, a suspended framework is formed, thus providing excellent heat isolating effects. Furthermore, since such a suspended structure allows the thin pyroelectric sheet elements A1 and A2 as well as other added elements to be all arranged on the same plane of the circuit board, an automated assembling operation can be performed using the surface mounting technique and equipment. Moreover, because of the electrical insulation of the circuit board itself, there is no need for additional insulation pads. Also, since the circuit board can be laid out for various applications, the required number of ultrasonic wire welding is reduced. In addition, the double-sided circuit board can effectively prevent interference from electromagnetic noise.

After assembly and test, the structure in FIGS. 4A and 4B can be fitted into a cover casing. As shown in FIG. 4C, the top of the cover 206 has an IR window 207 which receives multi-layer thermal IR filtering plate 208 for permitting the radiative thermal energy to pass through. The cover 206 also has flanges on the inner edge of the cover (not shown) so that when the circuit board 201 abuts exactly against said flanges to fix a relative distance between the pyroelectric elements A1 and A2 and the IR window 207 for precise optical sensing. Finally, over the side of the circuit board 201 opposite to that fitted into the cover 206, an epoxy resin is injected and thermally cured for airtight sealing. The cover 206 can be made of metal formed by a pressing technique and then plated with metal to obtain the electrical, noise isolation and water resistance benefits.

Moreover, no pins are needed for the through holes 202 of the circuit board 201. After having been assembled and tested, the structure shown in FIGS. 4A and 4B can be welded to the pin ends (the elements 210 shown in FIGS. 6A and 6B) of a conventional TO metal base so as to float on the base surface. Then a metal cover having a filter window is welded using standard TO metal packaging equipment to obtain the finished product.

As can be appreciated from the foregoing, the prior device and structure (ROC Utility Model Patent No. 67164) has the following advantages:

1. All the elements are adhered on the plane of one circuit board. Therefore, automated assembly using currently available surface bonding equipment can be employed so as to achieve the benefit of quantity production at lowest cost.

2. The pre-pressing undercut well 205 enables the pyroelectric elements placed thereon to be implemented in a suspended structure without requiring insulating pads, thus reducing the costs of processing and materials.

3. The circuit board is used as the base, eliminating the need for an expensive metal base.

4. Insulating pads are no longer required between the sensing elements and the metal base, thus reducing material and processing costs.

5. Layout connection on the circuit board enables the required wire welding to be reduced.

However, all the conventional structures, including the above R.O.C. Utility Model Patent No. 67164, have the disadvantage that the widest viewing angle available to their heating sensing elements is limited no more than 110 degrees. In order to increase the viewing angle, the cost of the materials and the volume of the structure have to be increased. The reasons are described by reference to FIGS. 6A and 6B as follows:

In FIG. 6A there is shown the schematic cross view of the packaging structure of R.O.C. Utility Model Patent No. 67164. From the light rays rm1 and rm2, it can be seen that the sensing devices of such a geometry have a maximum viewing angle $\Theta m$, generally about 110 degrees for presently available products. In application, the viewing angle of such a structure can hardly cover the angle of a half circle, i.e., 180 degrees, such as that bounded by a wall (as the diagram shown in FIG. 5). Two approaches can be used to increase the view angle:

The first approach is to enlarge the dimensions of the viewing window 207 for the filtering plate 208, shown by reference letter W in the figure. This, however, will increase both the material cost and the packaging volume because the filtering plate 208 transmissive to thermal IR heat waves of 8–14 micron wavelength are made of expensive silicon ships which must be coated with tens of layers of germanium and zinc sulfide films. The fabrication of this plate is therefore time-consuming and quite expensive. Moreover, with the dimensions being increased, the metal base has to be enlarged, further increasing the volume and the material cost.

The second approach is to reduce the distance H, as shown in FIG. 6A, between the sensing elements A1 and A2 and the filtering plate 208. This approach avoids the disadvantages of the first approach. However, a welding wire 209 must be applied on the upper surface of the elements A1 and A2 to connect them with the external circuits; accordingly, a gap must exist for the welding wire 209. Therefore, the volume of such a structure needs to be enlarged and the viewing angle can not be improved properly. In short, increasing the viewing angle has unfavorable effects on the cost and volume of the elements.

SUMMARY OF THE INVENTION

To solve the problems encountered in the prior art, the primary object of the present invention is to provide a planarized-packing device and structure for pyroelectric IR heat-sensing elements which is improved from the R.O.C. Utility Model Patent No. 67174.

The further object of the present invention is to provide a planarized-packing device and structure for pyroelectric IR heat-sensing elements which has a larger viewing angle without increasing cost and volume.

These and other objects, advantages and features of the present invention will be more fully understood and appreciated by reference to the written specification.

THE DESCRIPTION OF THE PREFERRED EMBODIMENT

Figure 1:
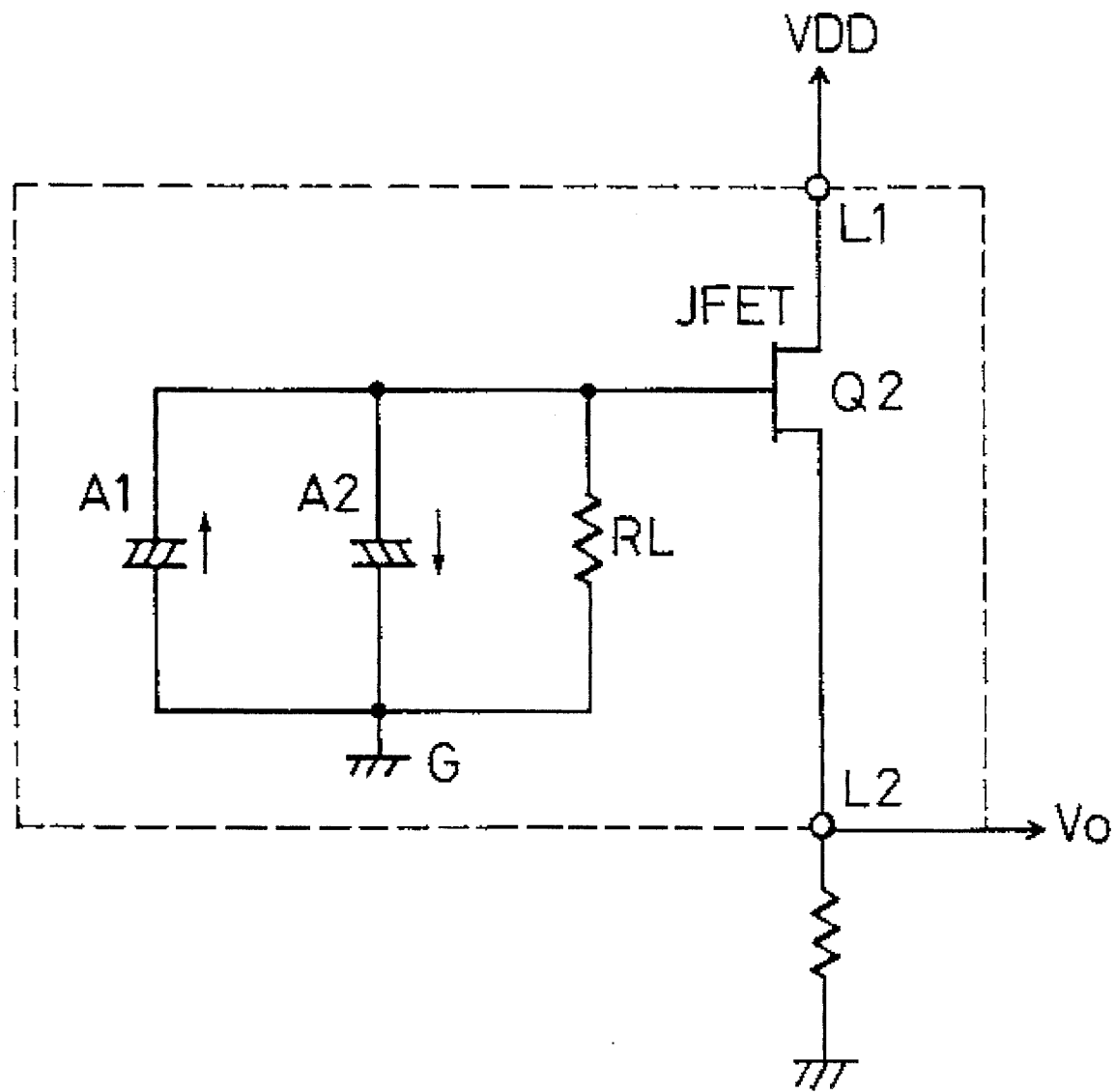
FIG. 1 shows an equivalent circuit of a conventional two-piece pyroelectric sensing element.
Figure 2:
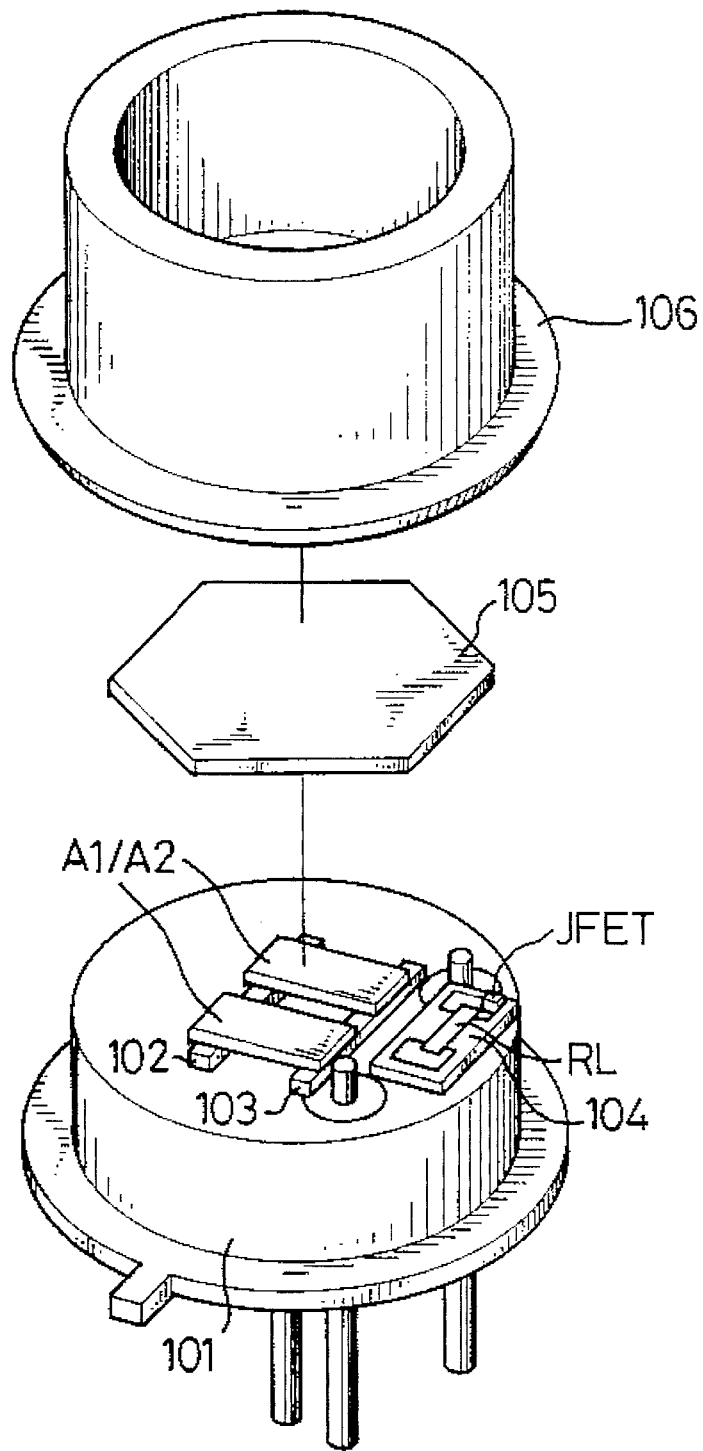
FIG. 2 shows a structural diagram of a conventional pyroelectric sensing element.
Figure 3:
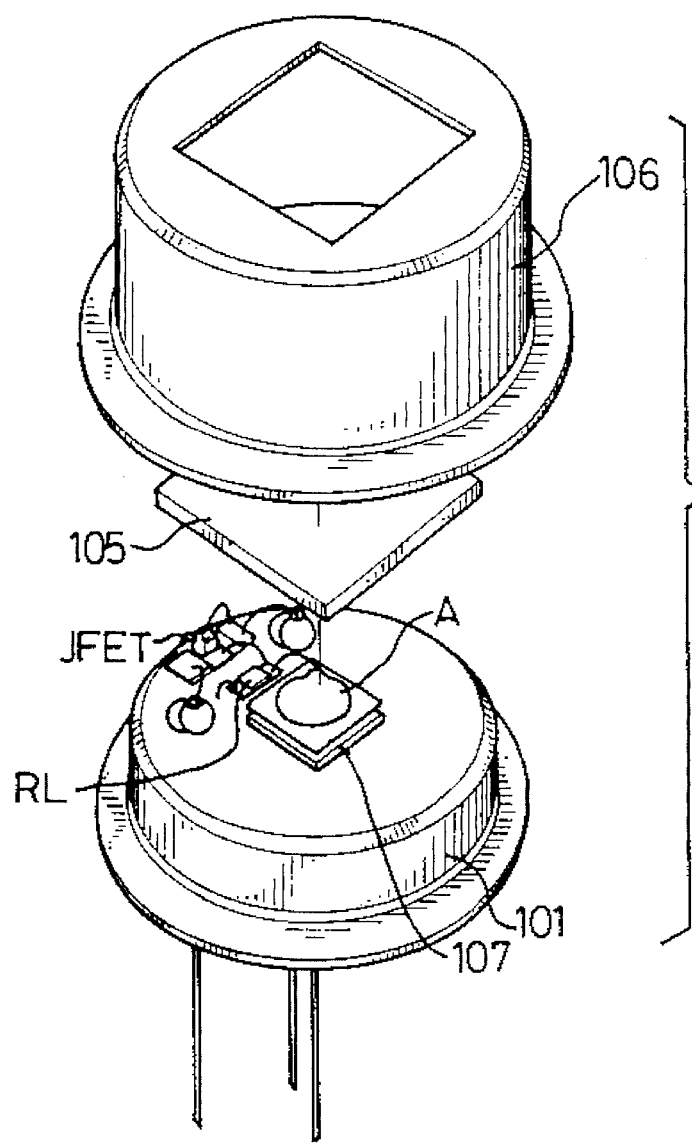
FIGS. 3 and 3A show a structural diagram of another conventional pyroelectric sensing element.
Figure 3A:
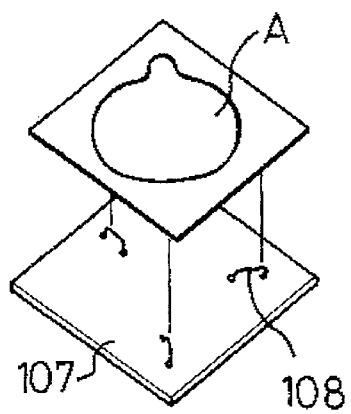
Figure 4A:
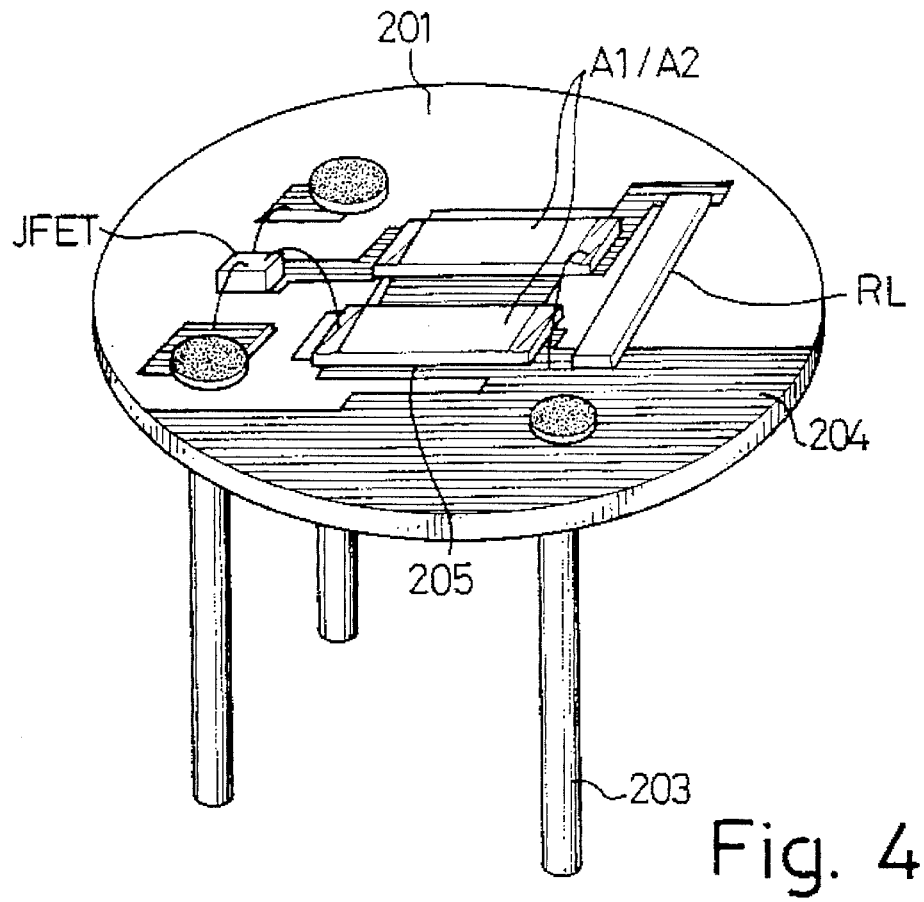
FIG. 4A is a structural diagram of a prior pyroelectric sensing element wherein the heat sensing elements A1 and A2 are suspended on a PCB.
Figure 4B:
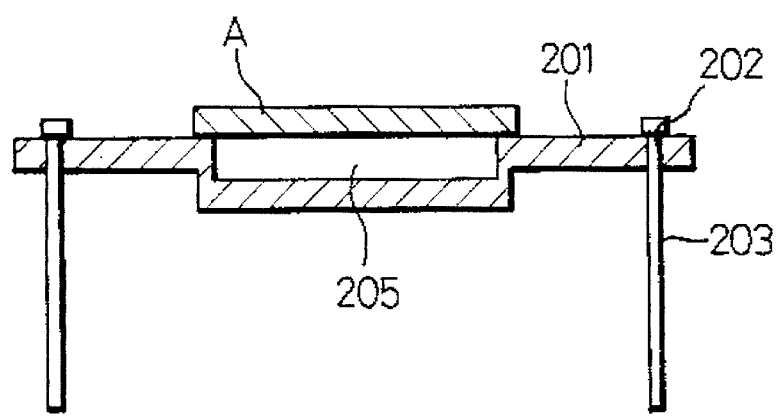
FIG. 4B is a side sectional view of the suspended structure shown in FIG. 4A.
Figure 4C:
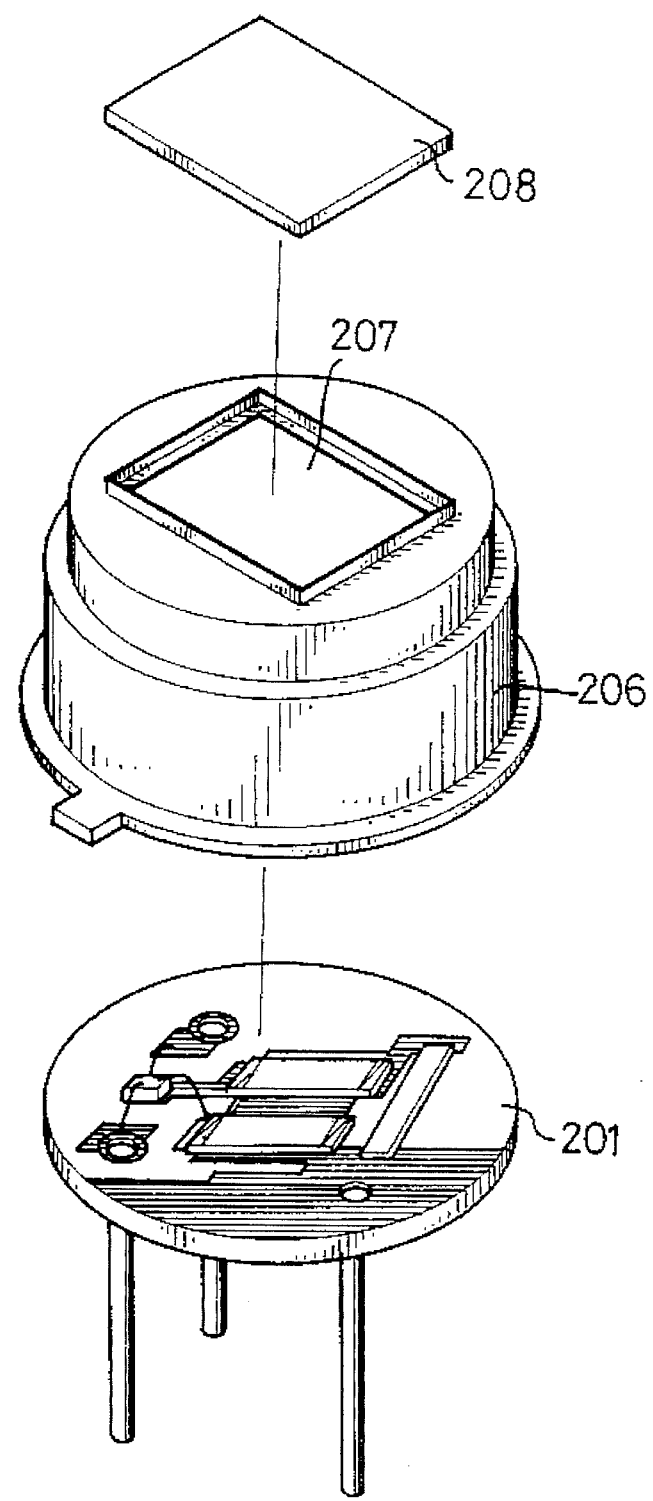
FIG. 4C is an exploded view of a package structure of the pyroelectric sensing element of FIG. 4A.

An object of the present invention is to further increase the view angle of a pyroelectric IR heat-sensing device based on R.O.C. utility model patent No. 67174. Referring to FIGS. 7 and 8A–8C, the planarized-packing structure of the pyroelectric IR heat-sensing device of the present invention includes a base plate 301, a cover 306 with an IR window 307 and an IR filtering plate 308. The base plate 301 is provided with a recess 305 having a specific configuration. The recess 305 is formed on a base plate 301 by a pressing technique. The heat-sensing elements A1 and A2 are positioned across the width of the recess 305 to form a suspended structure.

The recess 305 is configured to be rectangular in shape, but on the sides which contact with the heat-sensing elements A1 and A2 there are two pairs of opposite extended recessed portions 305', making the width of the recess 305 at the extended portions larger than the length of the heat-sensing elements A1 and A2. The width of each of the opposite extended recessed portions 305' is smaller than that of the heat-sensing elements A1 and A2. Therefore, when the heat-sensing elements A1 and A2 are welded on the base plate 301 (at welded points 310), the elements A1 and A2 will partially fall into the recess 305 such that they are inclined to the recess 305 in a face-to-face manner while still suspended in the recess 305 as shown in FIG. 8A.

Figure 5:
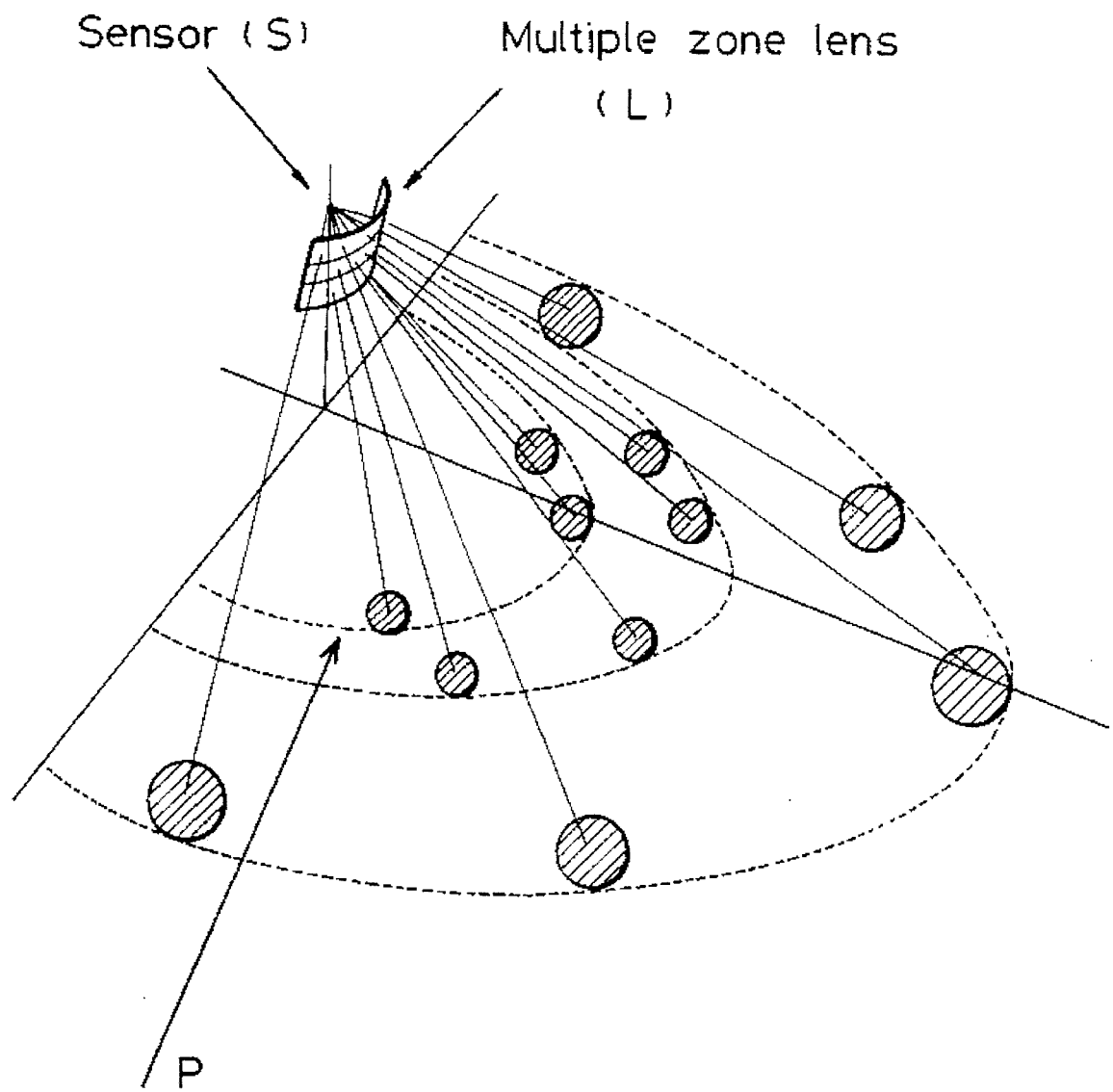
FIG. 5 shows a view division diagram of an array of IR lenses.
Figure 6A:
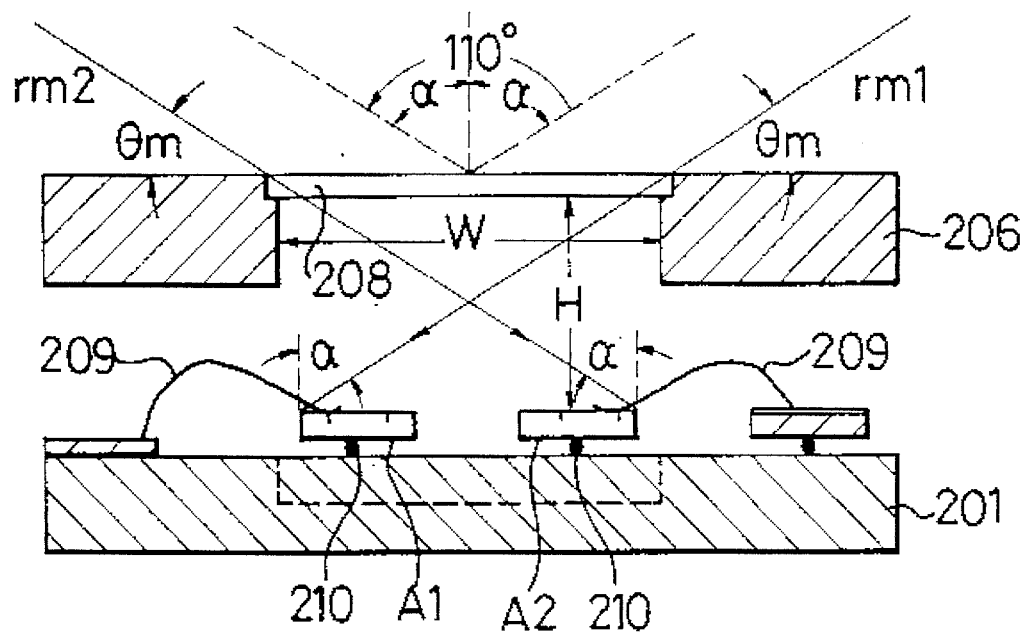
FIGS. 6A and 6B show a side cross sectional view and a lower sectional view of the package structure of FIG. 4C.
Figure 6B:
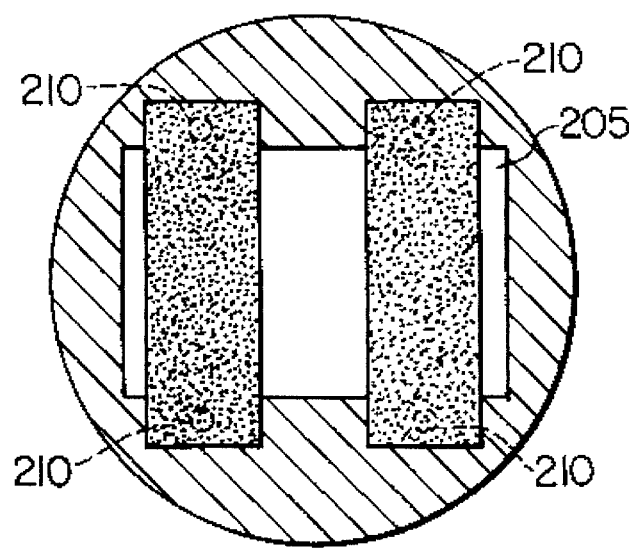
Figure 7:
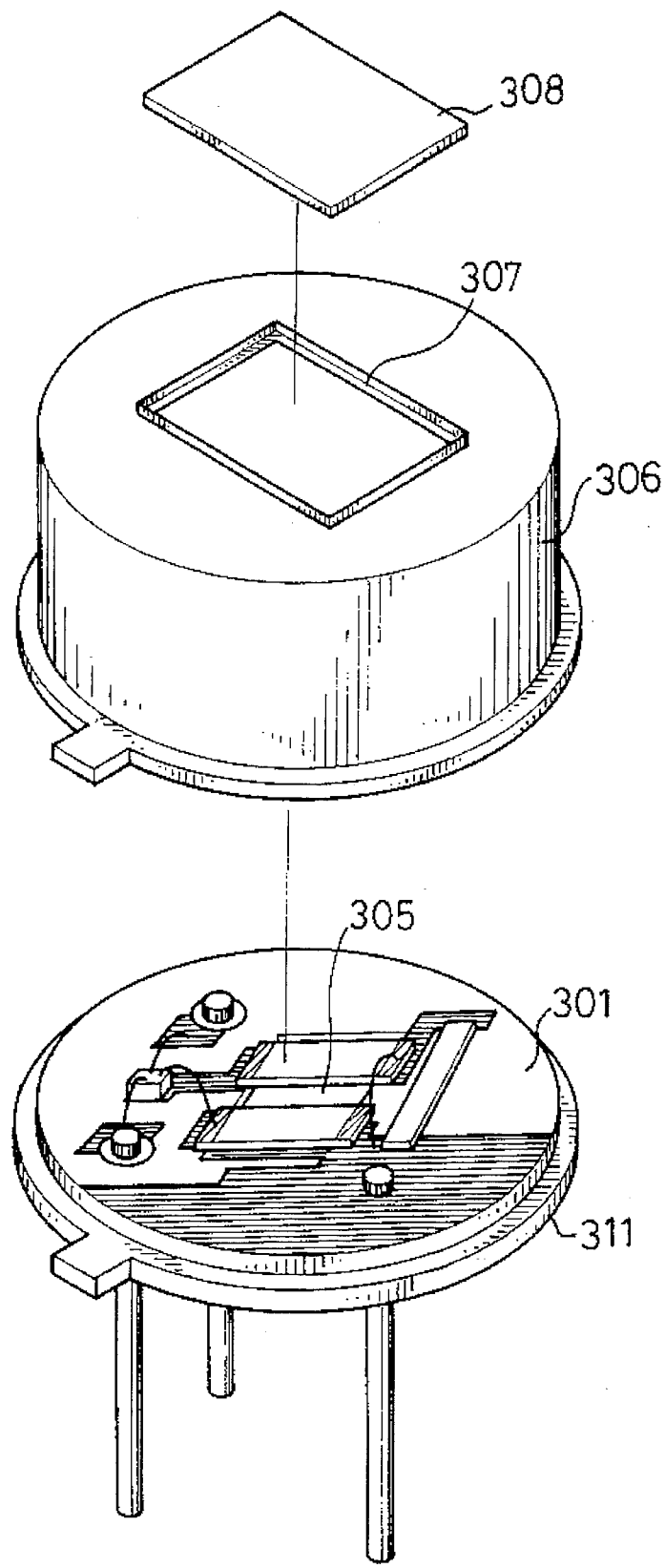
FIG. 7 is an exploded view of a package structure of the pyroelectric heat-sensing element in accordance with the present invention.
Figure 8A:
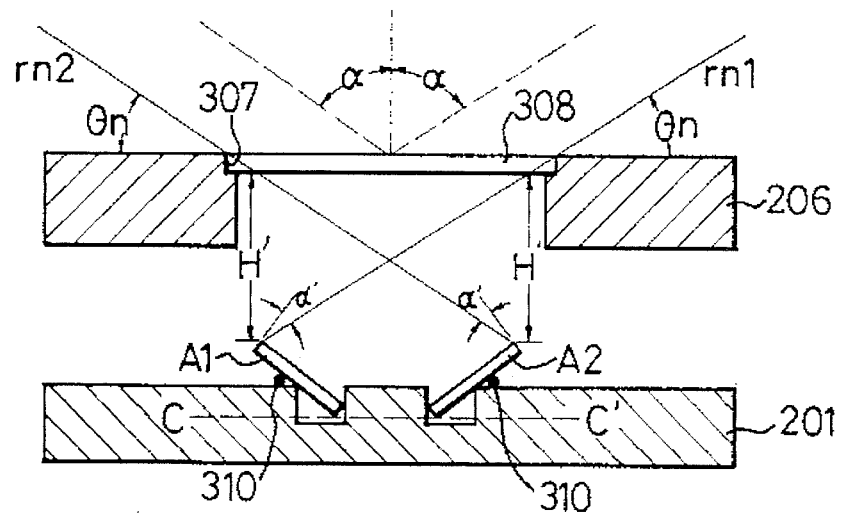
FIG. 8A is a schematic side cross sectional view of the package structure of the pyroelectric sensing element shown in FIG. 7.
Figure 8B:
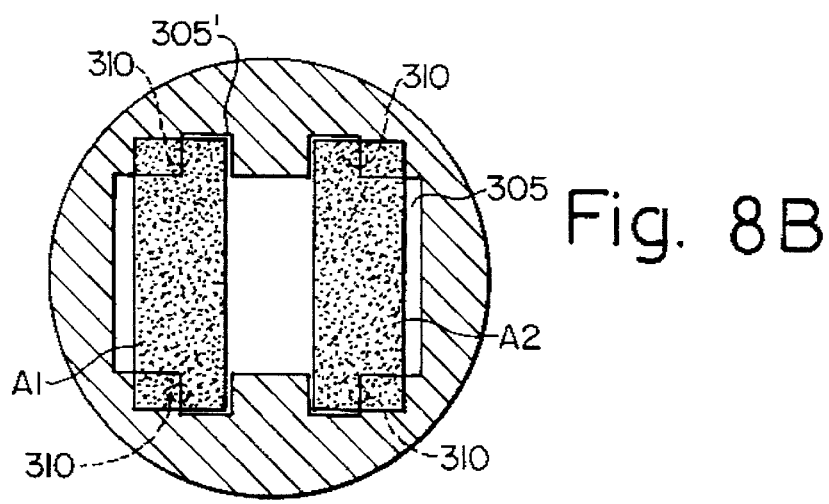
FIG. 8B is a top view showing the connection diagram of the pyroelectric sensing elements and the base of the structure of FIG. 8A.
Figure 8C:
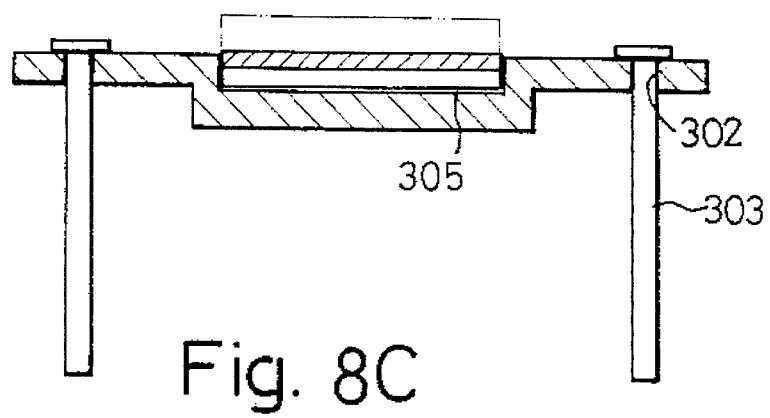
FIG. 8C shows a side cross view of the pyroelectric sensing element in accordance with the present invention viewed from the line C—C' of FIG. 8A, in which it can be seen that the heat sensing elements A1 and A2 are inclinedly suspended on the PCB.
Figure 9:
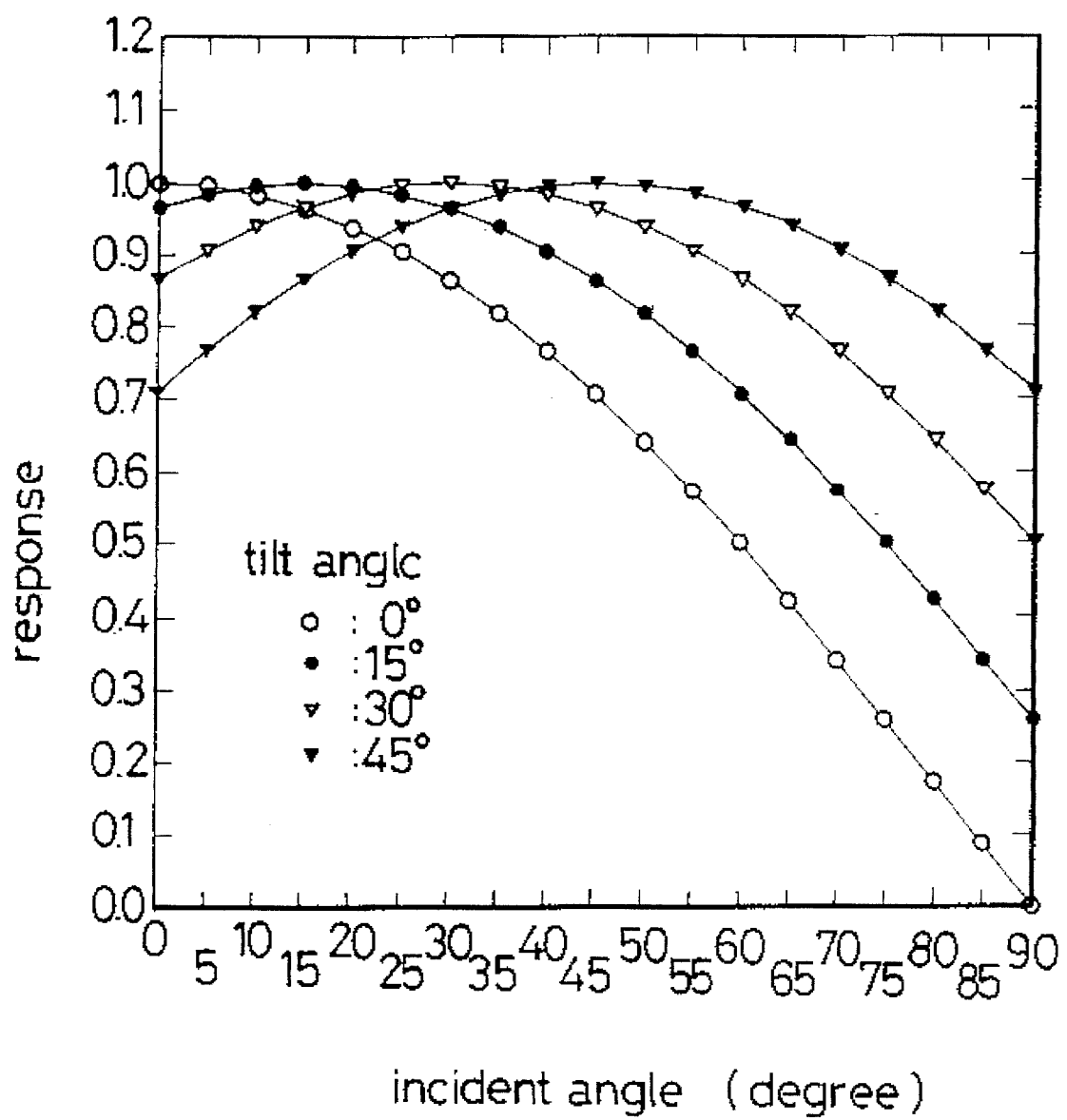
FIG. 9 shows a signal response distribution curve of the pyroelectric sensing elements of the present invention at various tilt angles.

As can be seen from FIG. 8A, the inclined yet suspended structure of the present invention has the following advantages:

(1) The inclined placement causes the outer edges of each of the heat-sensing elements A1 and A2 to have a distance H' from the filtering plate 308 smaller than H in FIG. 6A, which, as explained above, may increase the viewing angle of the device.; and (2) In the conventional horizontally placed structure, as shown in FIG. 6A, the "projection exposure" of the light incident on the heat-sensing elements is calculated by multiplying the incident amount of light and the projection of the incident angle, i.e., cos α. Thus, the valid received amount of light will vary according to the incident angle. When the incident angle approaches 90 degrees, cos α approaches zero such that the sensitivity of the heat-sensing device is lowered, making it difficult to increase the valid viewing angle. In the proposed structure of the present invention as shown in FIG. 8A, since the heat-sensing elements are positioned at an incline, the incident angle of the light on the sensing elements (α' in FIG. 8) is reduced to be less than α as in FIG. 6A, such that the valid received amount of light is much greater than that in the conventional structure. As shown in FIG. 9, the far field profile of the signal intensity at various inclined angles has been theoretically calculated. From the figure, it can be seen that the inclination of the heat-sensing elements yields a large viewing angle. Although the response for some smaller viewing angles is compromised to some extent, since the instrument is generally set in such a posture that a moving object being sensed typically crosses from the side at a large viewing angle (as shown by the moving direction P of the moving object in FIG. 5), the inclined structure overall improves the results of detection.

Figure 10:
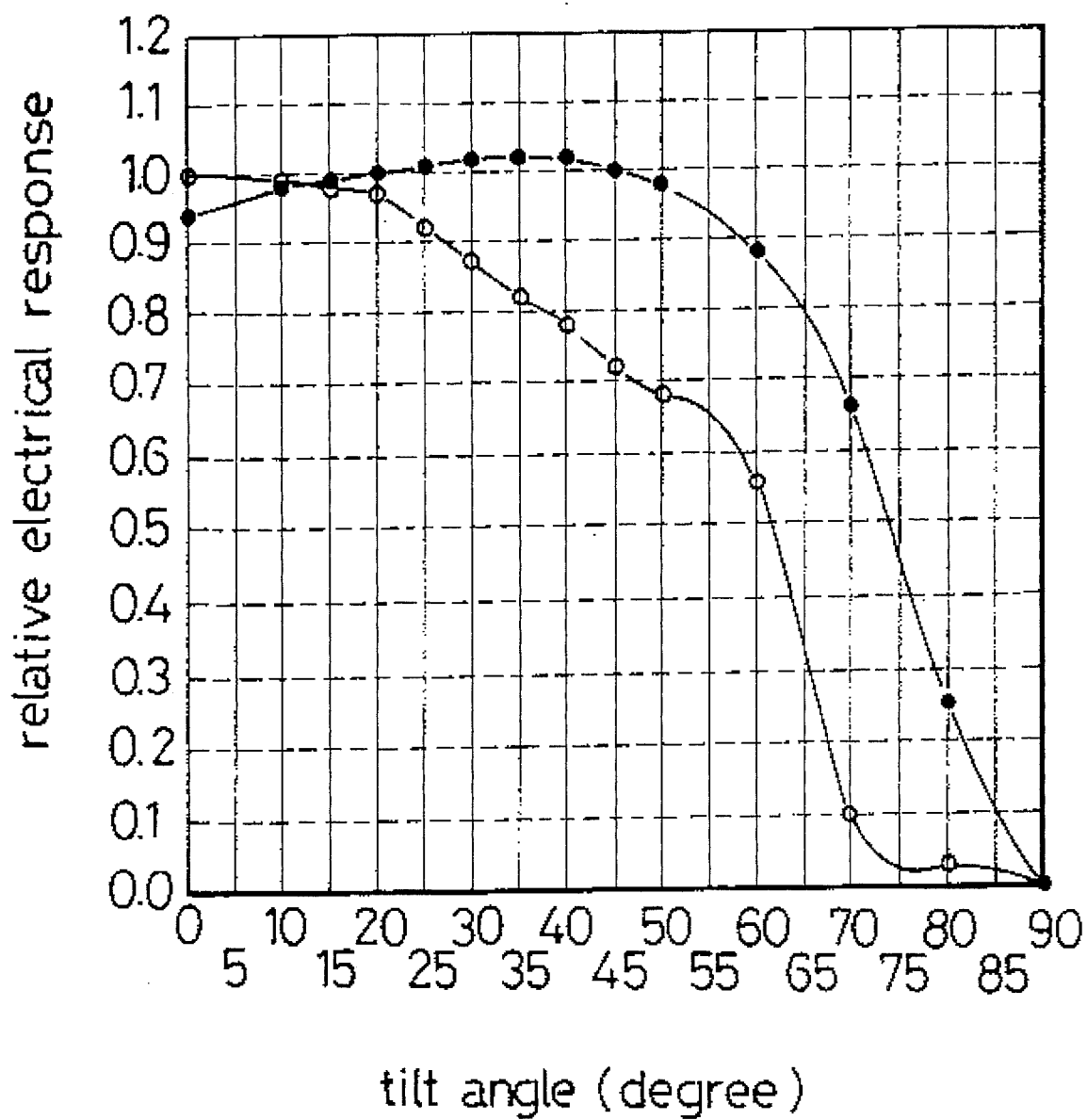
FIG. 10 shows the far field profile of the measured signal intensity with the thin pyroelectric plate inclined at 25 degrees.

FIG. 10 shows the measured results from the samples we researched. The curve with white dots represents the measurements of a given conventional (Japanese) product available in the market. Data indicated by black dots represent the measurements of the structure according to the present invention with the heat-sensing elements inclined at around 25 degrees. It is apparent that at half the maximal signal, the viewing angle of the conventional product is only about 125 degrees compared to nearly 150 degrees for the structure of the present invention; and at ¹/₁₀ of the maximal signal, the conventional product provides 140 degrees of detection while the present invention gives a viewing angle of as high as 170 degrees, nearly a half circle (limit).

Figure 11:
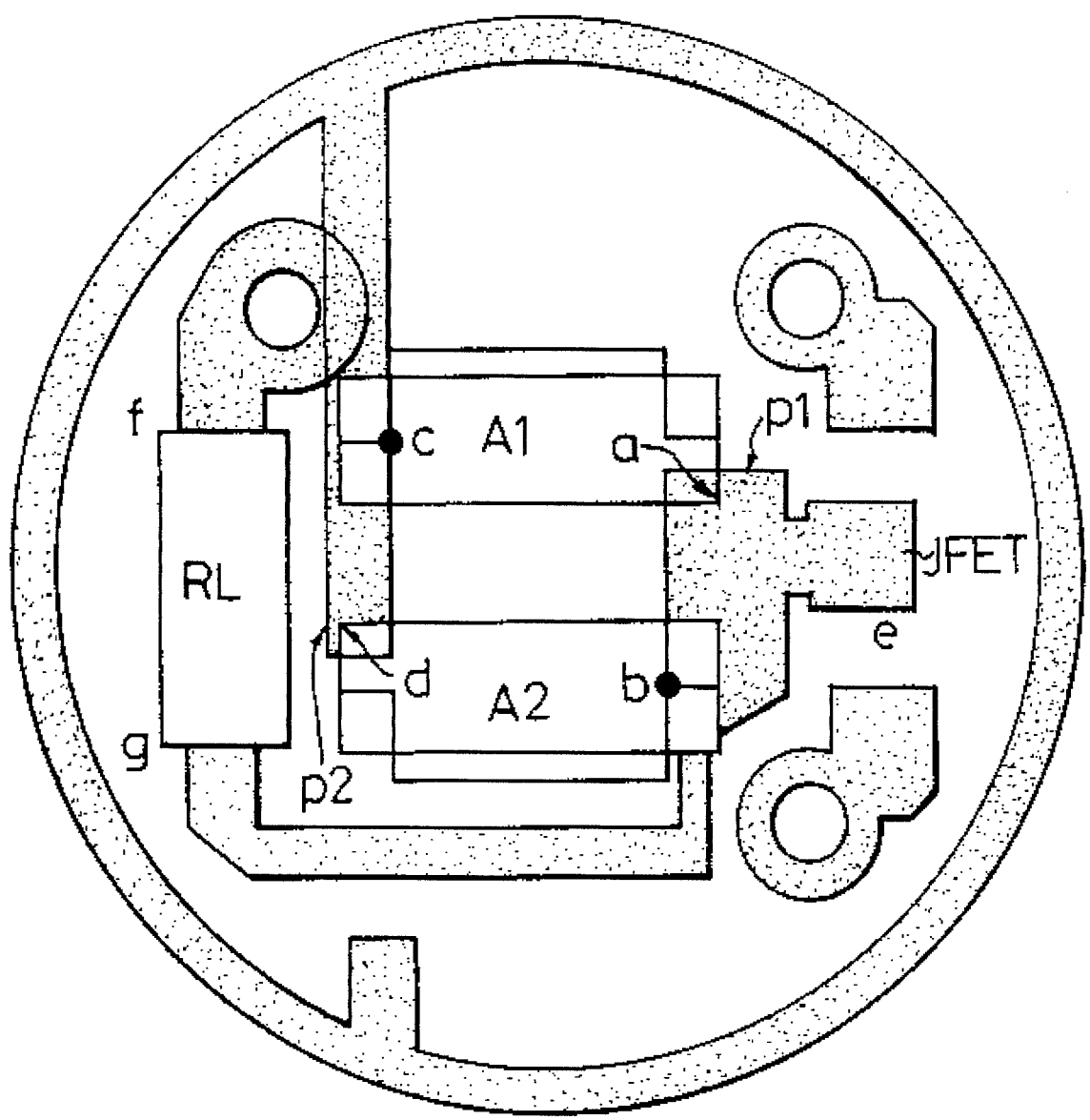
FIG. 11 is a top view of the structure of the pyroelectric heat-sensing element of the present invention.

In the following, an example of the process for making the structure of the pyroelectric IR heat-sensing device in accordance with the present invention is described:

1. A base plate (having holes 302 and pins 303 as in FIG. 8C) is formed by circuit wiring and pressing as shown in FIG. 11, wherein points a, b, c, and d all comprise interrupted layers as well as upper and lower copper foil layers (the portion with shading).

2. A silver adhesive is applied at points b and c where the pyroelectric heating-sensing elements A1 and A2 are placed, and at points e, f and g where the junction field effect transistor JFET and the load resistor RL are placed, wherein the silver adhesive at points b and c is applied on the PCB interrupted layers.

3. The pyroelectric heat-sensing elements A1 and A2 as well as the junction field effect transistor JFET and the load resistor RL are adhered at positions as shown in the drawing, and then cured by heating in an oven.

4. Then the silver adhesive is applied at points a and d and cured by heating in an oven such that the copper foils P1 and P2 on the interrupted layer are electrically connected to the pyroelectric heat-sensing elements A1 and A2. This step avoids the difficulty of wire welding on the inclined surface.

5. Wires are welded to complete the necessary circuit connections.

6. The structure after the above step attached with IR filter lenses is fitted into a metal casing and adhesive is applied on the back side. After the entire structure is cured by heating in an oven, the process of manufacturing the sensing device is completed.

In the following, another example of the process for making the structure of the pyroelectric IR heat-sensing device in accordance with the present invention is described:

1. A base plate (without the pins 303 as shown in FIG. 8C) is formed by circuit wiring and pressing as shown in FIG. 11, wherein points a, b, c, and d all comprise interrupted layers as well as upper and lower copper foil layers.

2. A silver adhesive is applied at points b and c where the pyroelectric heat-sensing elements A1 and A2 are placed, and at points e, f, and g where the junction field effect transistor JFET and the load resistor RL are placed, wherein the silver adhesive at points b and c is applied on the PCB interrupted layers.

3. The pyroelectric heat-sensing elements A1 and A2, as well as the junction field effect transistor JFET and then load resistor RL, are adhered at positions as shown in the drawing, and then cured by heating in an oven.

4. Then the silver adhesive is applied at points a and d, and cured by heating in an oven such that the copper foils P1 and P2 on the interrupted layer are electrically connected to the pyroelectric heat-sensing elements A1 and A2. This step avoids the difficulty of wire welding on the inclined surface.

5. Wires are welded to complete the necessary circuit connections.

6. The base plate 301 is supported high over a pin of a TO metal base and aligned with the through holes 302, then welded.

7. The metal cover 306 and the metal base are sealed and welded to become a finished product.

From the above description, it can be seen that by adhering the heat-sensing elements A1 to the recess 305 on the base plate 301 in an inclined and suspended manner, the planarized packaging structure can further enlarge the viewing angle without requiring any increased materials or volume.

The structure of the present invention has been described by way of a preferred embodiment of a pyroelectric IR heat-sensing device. It is to be understood that various changes and modifications can be made to the embodiment by those skilled in the art without departing from the scope as set forth in the appended claims. For example, pyroelectric IR heat-sensing elements A1 and A2 can be replaced with heat sensitive resistant sheet elements (bolometer) of similar sizes or other like elements having similar heat inductive functions.

We claim:

1. A planarized-packing device for pyroelectric IR heat-sensing elements comprising a circuit board on which two pyroelectric heat-sensing elements and associated electronic elements are mounted, and a cover with a window and an IR filtering plate, said circuit board being pre-pressed to form a recess at the portion where said pyroelectric heat-sensing elements are attached so that said pyroelectric heat-sensing elements are bridged across said recess; said recess being such shaped that said pyroelectric heat-sensing elements can be placed inclined in said recess and formed into a suspended structure; the inclined angle of said pyroelectric heat-sensing elements being adjustable as desired.

2. The planarized-packing device for pyroelectric IR heat-sensing elements according to claim 1, wherein the inclined angle is in the range between 5 to 45 degrees.

3. The planarized-packing device for pyroelectric IR heat sensing elements according to claim 1, wherein a plurality of through holes are provided on said circuit board for externally connected pins to pass therethrough and secured by riveting.

4. The planarized-packing device for pyroelectric IR heat-sensing elements according to claim 1, wherein said circuit board is a ceramic plate, the recess of a special shape being previously sintered into form.

5. The planarized-packing device for pyroelectric IR heat-sensing elements according to claim 1, wherein said cover is stamping formed from a metal casing or injection molded from plastic and plated on the surface thereof with a metal such that electrical noises are isolated.

6. The planarized-packing device for pyroelectric IR heat-sensing elements according to claim 1, wherein said circuit board is suspended on a conventional TO metal base such that external leads of the board and projected pins on the metal base are aligned and welded, and that the metal cover and the metal base are sealed and welded to become a finished product.

7. The planarized-packing device for pyroelectric IR heat-sensing elements according to claim 1, wherein said pyroelectric IR heat-sensing elements are replaceable by IR heat-sensing sheet elements made of heat sensitive resistant materials.

\* \* \* \* \*